(12) United States Patent
Goyal

(10) Patent No.: US 6,670,308 B2
(45) Date of Patent: Dec. 30, 2003

(54) METHOD OF DEPOSITING EPITAXIAL LAYERS ON A SUBSTRATE

(75) Inventor: Amit Goyal, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 23 days.

(21) Appl. No.: 10/101,218

(22) Filed: Mar. 19, 2002

(65) Prior Publication Data

US 2003/0178102 A1 Sep. 25, 2003

(51) Int. Cl.[7] .................... H01L 39/24; C25D 9/00
(52) U.S. Cl. .............. 505/434; 505/470; 505/472; 505/739; 427/528; 427/531; 148/96; 205/157; 205/170; 205/333; 156/150
(58) Field of Search ............... 505/239, 430, 505/433, 434, 470, 472, 739; 427/523, 528, 531; 148/96, 240, 516; 205/137, 138, 143, 157, 170, 206, 209, 238, 261, 333; 29/DIG. 12; 156/150, 151

(56) References Cited

U.S. PATENT DOCUMENTS

| | | | | |
|---|---|---|---|---|
| 3,843,894 A | * | 10/1974 | Hunt et al. ............... 307/145 |
| 4,148,204 A | * | 4/1979 | Dotzer et al. ............... 72/39 |
| 5,249,358 A | * | 10/1993 | Tousignant et al. ....... 29/890.03 |
| 5,340,797 A | * | 8/1994 | Hodge et al. ............. 505/470 |
| 5,413,987 A | * | 5/1995 | Bhattacharya et al. ...... 505/492 |
| 5,415,761 A | * | 5/1995 | Mull ...................... 205/104 |
| 5,527,765 A | * | 6/1996 | Hodge et al. ............. 505/236 |
| 5,641,391 A | * | 6/1997 | Hunter et al. .............. 205/80 |
| 5,667,666 A | * | 9/1997 | Matsuura et al. .......... 205/640 |
| 5,739,086 A | | 4/1998 | Goyal et al. |
| 5,741,377 A | | 4/1998 | Goyal et al. |
| 5,789,348 A | * | 8/1998 | Bhattacharya .............. 505/492 |
| 5,898,020 A | | 4/1999 | Goyal et al. |
| 5,944,966 A | | 8/1999 | Suetsugu et al. |
| 5,958,207 A | * | 9/1999 | Mull ...................... 205/104 |
| 5,958,599 A | | 9/1999 | Goyal et al. |
| 6,319,385 B1 | * | 11/2001 | Mull ...................... 205/104 |
| 6,339,047 B1 | * | 1/2002 | Christopherson et al. ... 505/410 |
| 6,346,181 B1 | * | 2/2002 | Lee et al. ................ 205/89 |
| 6,402,592 B1 | * | 6/2002 | Zhu et al. ................ 451/36 |
| 6,428,635 B1 | * | 8/2002 | Fritzemeier et al. ........ 148/435 |
| 6,436,182 B1 | * | 8/2002 | Unverdorben et al. ...... 106/412 |
| 6,436,267 B1 | * | 8/2002 | Carl et al. ................ 205/186 |
| 6,436,317 B1 | * | 8/2002 | Malozemoff et al. .... 252/519.1 |
| 6,455,166 B1 | | 9/2002 | Truchan et al. |
| 6,468,806 B1 | * | 10/2002 | McFarland et al. ......... 436/518 |
| 6,475,311 B1 | * | 11/2002 | Fritzemeier et al. ........ 148/677 |
| 6,482,656 B1 | * | 11/2002 | Lopatin .................... 438/2 |
| 2002/0132137 A1 | * | 9/2002 | Kawasaki et al. .......... 428/692 |
| 2002/0163759 A1 | * | 11/2002 | Kanada et al. ............. 360/126 |

FOREIGN PATENT DOCUMENTS

| | | |
|---|---|---|
| DE | 19925373 A1 | * 12/2000 |
| JP | 410152796 A | * 6/1998 |
| JP | 411302896 A | * 11/1999 |
| WO | WO 95/16281 | * 6/1995 |

OTHER PUBLICATIONS

Dimos, D., et al. "Orientation Dependence of Grain–Boundary Critical Currents in $YBa_2Cu_3O_{7-\delta}$ Bicrystals" Physical Review Letters, vol. 61, No. 2, Jul. 11, 1988, pp. 219–222;.

(List continued on next page.)

Primary Examiner—Tom Dunn
Assistant Examiner—Colleen P Cooke
(74) Attorney, Agent, or Firm—Akerman Senterfitt

(57) ABSTRACT

An epitaxial article and method for forming the same includes a substrate having a textured surface, and an electrochemically deposited substantially single orientation epitaxial layer disposed on and in contact with the textured surface. The epitaxial article can include an electromagnetically active layer and an epitaxial buffer layer. The electromagnetically active layer and epitaxial buffer layer can also be deposited electrochemically.

30 Claims, 11 Drawing Sheets

OTHER PUBLICATIONS

Dimos, D., et al. "*Superconducting Transport Properties of Grain Boundaries in $YBa_2Cu_3O_7$ Bicrystals*" Physical Review B, vol. 41, No. 7, Mar. 1, 1990, pp. 4038–4049;.

Cardona, A.H., et al. "*Transport Characteristics of $TI_2Ba_2CaCu_2O_8$ Bicrystal Grain Boundary Junctions at 77 K*", Appl. Phys. Lett. 62(4), Jan. 25, 1993, pp. 411–413;.

Kawasaki, M., et al. "*Weak Link Behavior of Grain Boundaries In Nd–, Bi–, and TI–based Cuprate Superconductors*" Appl. Phys. Lett. 62(4), Jan. 25, 1993, pp. 417–419;.

Nabatame, T., et al. "*Transport Superconducting Properties of Grain Boundaries in $TI_1Ba_2Ca_2Cu_3O_x$ Thin Films*" Appl. Phys. Lett. 65(6), Aug. 8, 1994, pp. 776–778;.

Tomita, N., et al. "*The Superconducting Properties of [001] Twist Boundaries in a Bi–Sr–Ca–Cu–O Superconductor*", Jpn. J. Appl. Phys. vol. 31 (1992), pp. L942–L945;.

Wang, J., et al. "*Electromagnetic Coupling Character of [001] Twist Boundaries in Sintered $Bi_2Sr_2CaCu_2O_{8+x}$ Bicrystals*" Physica C 230 (1994), pp. 189–198;.

Lijima, Y., et al. "*Structural and Transport Properties of Biaxially Aligned $YBa_2Cu_3O_{7-x}$ Films on Polycrystalline Ni–based Alloy with Ion–Beam–Modified Buffer Layers*" J. Appl. Phys. 74 (3), Aug. 1, 1993, pp. 1905–1911;.

Reade, R.P., et al. "*Laser Deposition of Biaxially Textured Yttria–Stabilized Zirconia Buffer Layers on Polycrystalline Metallic Alloys for High Critical Current Y–Ba–Cu–O Thin Films*" Appl. Phys. Lett. 51 (18), Nov. 2, 1992, pp. 2231–2233;.

Wu, X.D., et al. "*High Current $YBa_2Cu_3O_{7-\delta}$ Thick Films on Flexible Nickel Substrates with Textured Buffer Layers*", Appl. Phys. Lett. 65 (15), Oct. 10, 1994, pp. 1961–1963;.

Goyal, A., et al. "*Conductors with Controlled Grain Boundaries: An Approach to the Next Generation, High Temperature Superconducting Wire*" J. Mater. Res., vol. 12, No. 11, Nov., 1997, pp. 2924–2940.

* cited by examiner

METHOD OF DEPOSITING EPITAXIAL LAYERS ON A SUBSTRATE

STATEMENT REGARDING FEDERALLY SPONSORED RESEARCH OR DEVELOPMENT

The United States Government has rights in this invention pursuant to Contract No. DE-AC05-00OR22725 between the United States Department of Energy and UT-Battelle, LLC.

CROSS-REFERENCE TO RELATED APPLICATION

FIELD OF THE INVENTION

The invention relates generally to epitaxial layers on biaxially textured surfaces and articles made therefrom. More specifically, the invention relates to a process for depositing epitaxial layers on biaxially textured substrates and associated articles.

BACKGROUND OF THE INVENTION

Many device applications require control of the grain boundary character of polycrystalline materials which form part of the device. For example, in high temperature superconductors grain boundary characteristics are important. The significant effect of grain boundary characteristics on current transmission across superconductor grain boundaries has been clearly demonstrated for Y123. For clean, stoichiometric boundaries, the grain boundary critical current $J_c$ (gb) appears to be determined primarily by the grain boundary misorientation. The dependence of $J_c$ (gb) on misorientation angle has been determined by Dimos et al. [1] in Y123 for several grain boundary types, which can be formed in epitaxial films on bicrystal substrates. These include [001] tilt, [100] tilt, and [100] twist boundaries [1]. In each case, high angle grain boundaries were found to be weak-linked. The $J_c$ value decreases exponentially with increasing grain boundary misorientation angle in artificially fabricated bicrystals of YBCO films [1]. The low $J_c$ observed in randomly oriented polycrystalline Y123 can be explained by the small percentage of low angle boundaries, the high angle grain boundaries impeding long-range current flow.

Recently, the Dimos experiment has been extended to artificially fabricated [001] tilt bicrystals in $Tl_2Ba_2CaCu_2O_8$ [2], $Tl_2Ba_2Ca_2Cu_3O_x$ [3], $TlBa_2Ca_2Cu_2O_x$ [4] and $Nd_{1.85}Ce_{0.15}CuO_4$ [3]. In each case it was found that, as in Y123, $J_c$ depends strongly on the distribution of grain boundary misorientation angles. Although no such measurements have yet been made on Bi-2223, data on current transmission across artificially fabricated grain boundaries in Bi-2212 indicates that most large angle [001] tilt [3] and twist [5,6] grain boundaries are weak links, with the exception of some coincident site lattice (CSL) related boundaries [5,6]. It is likely that the variation in $J_c$ with grain boundary misorientation in Bi-2212 and Bi-2223 will be similar to that observed in the well characterized cases of Y123 and Tl-based superconductors. Hence in order to fabricate high temperature superconductors with very high critical current densities, it is necessary to biaxially align the grains to produce a high percentage of low angle grain boundaries. This has been shown to result in significant improvement in the superconducting properties of YBCO films [7–10].

A simple method to fabricate long lengths of textured substrates with primarily low-angle grain boundaries for epitaxial deposition of high temperature superconducting (HTS) materials was proposed by Goyal et al. [10]. This method is known as Rolling-Assisted-Biaxially-Textured-Substrates (RABiTS). Four U.S. patents have been issued on this process and related process variants (U.S. Pat. Nos. 5,739,086, 5,741,377, 5,898,020 and 5,958,599). In the RABiTS method, the substrate formed has primarily low angle grain boundaries. A patent has also been issued on the fabrication of biaxially textured alloy substrates by Goyal et al. (U.S. Pat. No 5,944,966). An important issue in the successful use of alloy substrates in many applications is the ability to deposit high quality epitaxial buffer layers on the substrate.

References Cited:
1. D. Dimos, P. Chaudhari, J. Mannhart, and F. K. LeGoues, Phys. Rev. Lett. 61, 219 (1988); D. Dimos, P. Chaudhari, and J. Mannhart, Phys. Rev. B 41, 4038 (1990).
2. A. H. Cardona, H. Suzuki, T. Yamashita, K. H. Young and L. C. Bourne, Appl. Phys. Lett., 62 (4), 411, 1993.
3. M. Kawasaki, E. Sarnelli, P. Chaudhari, A. Gupta, A. Kussmaul, J. Lacey and W. Lee, Appl Phys. Lett., 62(4), 417 (1993).
4. T. Nabatame, S. Koike, O B. Hyun, I, Hirabayashi, H. Suhara and K. Nakamura, Appl. Phys. Lett. 65 (6), 776 (1994).
5. N. Tomita, Y. Takahashi and Y. Ishida, Jpn. J. Appl. Phys., 29 (1990) L30; N. Tomita, Y. Takahashi, M. Mori and Y. Ishida, Jpn. J. Appl. Phys., 31, L942 (1992).
6. J. L. Wang, X. Y. Lin, R. J. Kelley, S. E. Babcock, D. C. Larbalestier, and M. D. Vaudin, Physica C, 230,189 (1994).
7. Y. Iijima, K. Onabe, N. Futaki, N. Sadakata, O. Kohno and Y. Ikeno, J. of Appl. Phys., 74, 1905 (1993).
8. R. P. Reade et al., Appl. Phys. Lett., 61, 2231 (1992).
9. X. D. Wu, S. R. Foltyn, P. Arendt, J. Townsend, C. Adams, I. H. Campbell, P. Tiwari, Y. Coulter and D. E. Peterson, Appl. Phys. Lett., 65, 1961 (1994).
10. A. Goyal, D. P. Norton, D. M. Kroeger, D. K. Christen, M. Paranthaman, E. D. Specht, J. D. Budai, Q. He, B. Saffian, F. A. List, D. F. Lee, E. Hatfield, P. M. Martin, C. E. Clabunde, J. Mathis and C. Park, *Special 10th anniversary on High Temperature Superconductors of J. of Materials Research*, vol. 12, pgs. 2924–2940, 1997.

SUMMARY OF THE INVENTION

This invention provides a method for electrochemical deposition of epitaxial layers and formation of epitaxial articles. The method provides an inexpensive, non-vacuum technique that can proceed at a very high rate.

An epitaxial article is formed where at least one layer of the article is deposited using an electrochemical process. A substrate is provided having a biaxially textured surface. A substantially single orientation epitaxial layer deposited by an electrochemical process is disposed on and in contact with the biaxially textured surface.

A substantially single orientation epitaxial layer, as used herein, refers to a single orientation epitaxial layer having only one epitaxial crystallographic relationship with the surface in question. The substantially single orientation epitaxial layer preferably provides both in-plane texture and out-of-plane texture of less than 15 degrees FWHM, more preferably being less than 10 degrees FWHM.

The substrate can be a rolled and annealed biaxially-textured substrate having a biaxially textured metal surface. Textured metal surfaces can include Cu, Ag, Ni, Fe, Pd, Pt, Al, and alloys thereof. The substrate can also be a single crystal substrate. The substrate can be Si or GaAs, these substrates preferably being single crystal substrates.

The substantially single orientation epitaxial layer can be a metal or metal alloy layer, the metal or metal alloy layer selected from Cu, Ag, Ni, Fe, Pd, Pt and Al, and alloys thereof. The substantially single orientation epitaxial layer can provide both in-plane texture and out-of-plane texture of less than 10 degrees FWHM. At least one epitaxial buffer layer can be disposed on the substantially single orientation epitaxial layer.

The article can include an epitaxial electromagnetically active layer, such as a superconducting layer, disposed on and in contact with the epitaxial buffer layer. The superconductor layer can be an oxide superconductor. The oxide superconductor is preferably selected from $REBa_2Cu_3O_7$ where RE is a rare earth element, and $(Bi, Pb)_1Sr2Ca_{n-1}Cu_nO_{2n+2}$, where n is an integer between 1 and 4, $(Tl, Pb)_1Ba_2Ca_{n-1}Cu_nO_{2n+2}$, where n is an integer between 1 and 4, and $(Hg, Tl, Pb)_1Ba_2Ca_{n-1}Cu_nO_{2n+2}$, where n is an integer between 1 and 4. It is noted that (Bi, Pb) and (Tl, Pb) and (Hg, Tl, Pb) as used above imply any amount of doping of Pb, in (Tl, Pb) and (Bi, Pb) compounds and any amount of doping of Tl and Pb in (Hg, Tl, Pb) compounds. Furthermore, doping of Ca in RE for the $REBa_2Cu_3O_7$ compound is also possible.

A method for electrochemically depositing epitaxial layers on substrates includes the step of providing a substrate with a textured surface. A substantially single orientation epitaxial layer is electrochemically deposited on the textured surface. The textured surface can be a metal surface, the metal surface preferably being biaxially-textured.

A biaxially-textured metal surface may be provided by rolling and annealing a metal material. Textured metal surfaces, preferably being biaxially-textured can be formed from rolling and annealing substrates such as Cu, Ag, Ni, Fe, Pd, Pt or Al, and alloys thereof. The substantially single orientation eiptaxial layer can also be a metal or metal alloy layer, the metal or metal alloy layer selected from Cu, Ag, Ni, Fe, Pd, Pt or Al, and alloys thereof. The substantially single orientation epitaxial layer can provide both in-plane texture and out-of-plane texture of less than 10 degrees FWHM.

The electrochemical deposition process can produce a deposition rate of at least 1 $\mu$m/min and consist of either electroplating or electroless plating.

Improved epitaxial crystal quality can be obtained varying the deposition rate during the electrochemical deposition process, particularly by slowing the deposition rate which can otherwise increase over time. For example, the deposition rate can be varied by substantially suspending deposition during at least one interval during the time for the electrochemical deposition process. This can be accomplished by turning off the power supply in the case of an electroplating process.

The textured metal surface can be translated during the electrochemical deposition. For example, a reel-to-reel mechanism may be used for this purpose.

A method for electrochemically preparing an electromagnetically active epitaxial article includes the steps of providing a substrate with a textured surface, electrochemically depositing a substantially single crystal epitaxial layer onto the textured surface and depositing an electromagnetically active layer onto the substantially single crystal epitaxial layer. The textured surface is preferably biaxially-textured. Metal material can be rolled and annealed to form the biaxially-textured substrate, such as Cu. Ag, Ni, Fe, Pd, Pt, Al, or their respective alloys. The substantially single orientation epitaxial layer can also be a metal or metal alloy layer, the metal or metal alloy layer selected from Cu, Ag, Ni, Fe, Pd, Pt, Al, or their respective alloys. The substantially single orientation epitaxial layer can provide both in-plane texture and out-of-plane texture of less than 10 degrees FWHM.

At least one epitaxial buffer layer can be disposed on the epitaxial substantially single orientation layer, such as an epitaxial electromagnetically active layer or an epitaxial buffer layer. The electromagnetically active layer can be a superconducting layer, preferably an oxide superconductor.

The oxide superconductor is preferably selected from $REBa_2Cu_3O_7$ where RE is a rare earth element, and $(Bi, Pb)_1Sr2Ca_{n-1}Cu_nO_{2n+2}$, where n is an integer between 1 and 4, $(Tl, Pb)_1Ba_2Ca_{n-1}Cu_nO_{2n+3}$, where n is an integer between 1 and 4, and $(Hg, Tl, Pb)_1Ba_2Ca_{n-1}Cu_nO_{2n+2}$, where n is an integer between 1 and 4. It is noted that (Bi, Pb) and (Tl, Pb) and (Hg, Tl, Pb) as used above imply any amount of doping of Pb, in (Tl, Pb) and (Bi, Pb) compounds and any amount of doping of Tl and Pb in (Hg, Tl, Pb) compounds. Furthermore, doping of Ca in RE for the $REBa_2Cu_3O_7$ compound is also possible. The electromagnetically active layer, such as a superconducting layer, can be deposited by an electrochemical deposition process.

At least one epitaxial buffer layer can be deposited on and in contact with the substantially single crystal epitaxial layer. An electromagnetically active layer, such as a superconductor layer can be disposed on the epitaxial buffer layer. In this embodiment, the superconducting layer is preferably an oxide superconductor.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION OF THE PREFERRED EMBODIMENTS

This invention uses electrochemical deposition to form substantially single orientation epitaxial layers. For example, a substantially single orientation epitaxial metal layer can be electrodeposited on a textured electrically conductive surface. A substantially single orientation epitaxial layer, as used herein, refers to a single orientation epitaxial layer having only one epitaxial crystallographic relationship with the surface in question. The substantially single orientation epitaxial layer preferably provides both in-plane texture and out-of-plane texture of less than 15 degrees FWHM, more preferably being less than 10 degrees FWHM.

Conventional electroplating generally produces non-epitaxial, randomly oriented coatings. Using the invention, substantially single orientation epitaxial layers have been successfully electrochemically deposited on textured surfaces. The epitaxial layer may be used to form devices having electronically active layers disposed on the electrochemically deposited single orientation epitaxial layer.

Figure 1:
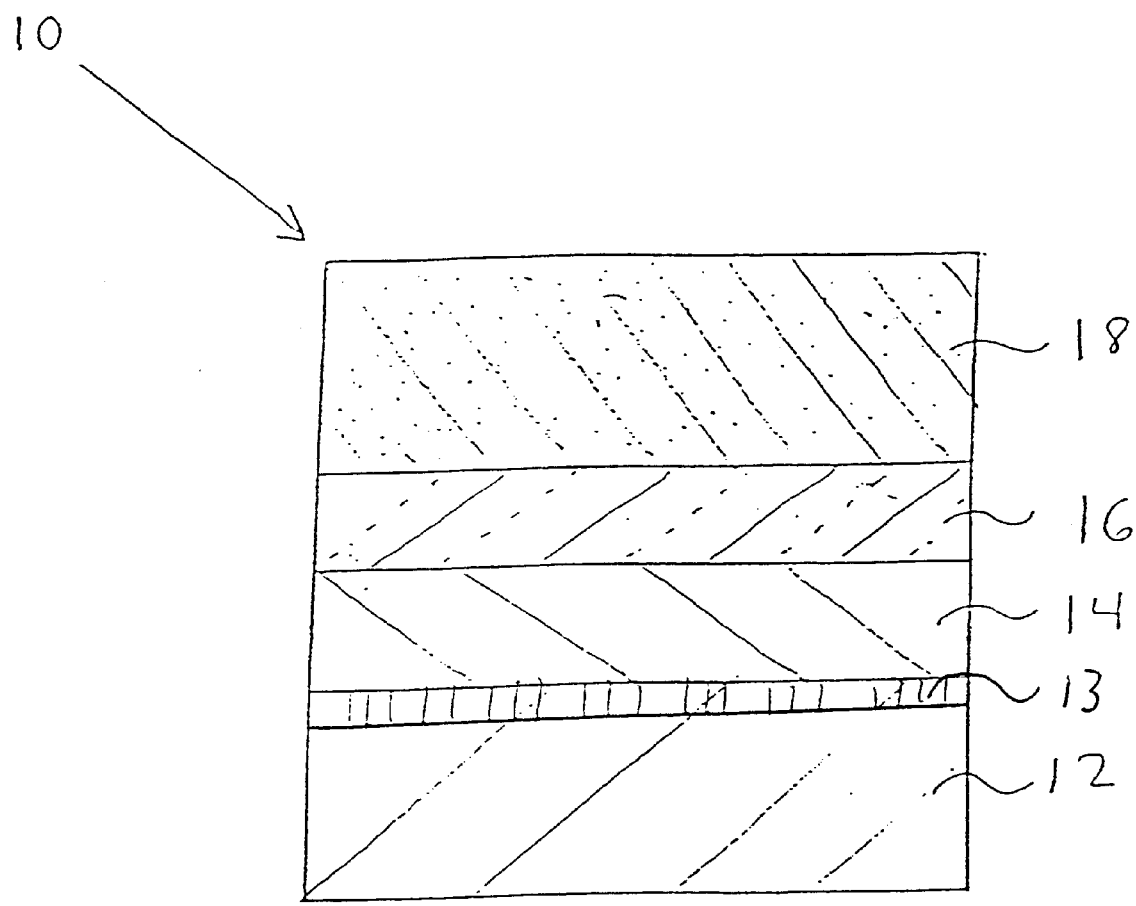
FIG. 1 is a cross-sectional view of a superconductor article formed using a substantially single orientation epitaxial metal layer electrochemically deposited on a substrate having a textured surface, according to an embodiment of the invention.

The electronically active layer may be a superconductor, a semiconductor, a ferro-electric or an opto-electric material. For example, a biaxially-textured superconductor article for power transmission lines generally has a multi-layer composition 10, as shown in FIG. 1. According to the invention, the superconductor article consists of a substantially single orientation epitaxial layer 13 disposed and in contact with a textured surface, such as a biaxially-textured metal surface 12. At least one epitaxial buffer layer, such as 14 and 16 can be disposed on the substantially single orientation epitaxial layer 13, and a superconducting layer 18 can be disposed on buffer layer 16.

The biaxially-textured surface 12 combined with epitaxial layer 13 provides support for the superconductor article, and can be fabricated over long lengths and large areas. Epitaxial buffer layers 14 and 16, such as metal oxide buffer layers can comprise the next layer in the superconductor article. The buffer layers 14 and 16 can be formed from suitable materials, such as $Y_2O_3$ or $CeO_2$, which can serve as chemical barriers between the single orientation epitaxial layer 13 and superconducting layer 18. Preferably, the buffer layer is an electrically conductive layer.

The superconductor layer 18 is preferably an oxide superconductor. The oxide superconductor is preferably selected from $REBa_2Cu_3O_7$ where Re is a rare earth element; and $(Bi, Pb)_1Sr_2Ca_{n-1}Cu_nO_{2n+2}$, where n is an integer between 1 and 4. $(Tl, Pb)_1Ba_2Ca_{n-1}Cu_nO_{2n+3}$, where n is an integer between 1 and 4, $(Hg, Tl, Pb)_1Ba_2Ca_{n-1}Cu_nO_{2n+2}$, where n is an integer between 1 and 4. It is noted that (Bi, Pb) and Tl, PB) and (Hg, Tl, Pb) imply any amount of doping of Pb, in (Tl, Pb) and (Bi, Pb) compounds and any amount of doping of Tl and Pb in (Hg, Tl, Pb) compounds. Furthermore, doping of Ca in RE for the $REBa_2Cu_3O_7$ compound is also possible.

The ability to deposit a substantially single orientation epitaxial layer 13 permits subsequent epitaxially grown layers to have correspondingly improved crystalline qualities. In particular, superconducting layer 18 having a high level of biaxial grain alignment results in a high percentage of low angle superconducting grain boundaries. The ability to form superconducting grains having a high percentage of low angle grain boundaries is known to result in significant improvement in the superconducting properties of various superconducting films.

The electrochemical depositing step can be any electrochemical deposition process. For example, electroplating or electroless plating may be used. Using electroplating, the depositing rate can be at least 0.1 $\mu$m/min, preferably at least 1.0 $\mu$m/min.

Electroplating is a method of applying an electrically conductive coating to another material. Although the invention is primarily described as being used to form single orientation epitaxial metals layers on textured metal substrates, the invention can be used to form other epitaxial layers for a given article. For example, applied to superconductor article 10 shown in FIG. 1, one or more of superconducting layer 18 and buffer layers 14 and 16 may be deposited by an electrochemical process.

Electrochemical deposition methods include processes such as electroplating, electroless plating, metal spraying and vacuum metallization. Electroplating is also referred to as electrodeposition.

Electroplating is performed in a solution called an electrolyte, also known as a plating bath. The plating bath is a specially designed chemical bath that has the desired metal (i.e. silver, gold) dissolved as charged ions in solution. The plating bath solution serves as a conductive medium and utilizes a low DC voltage which results in a direct current flow. The object to be plated is submerged into the plating bath and a low voltage DC current is applied to the bath. Generally located at the center of the plating bath, the object to be plated acts as an electrode, such as a negatively charged cathode. The positively charged anode completes the DC circuit. A power source combined with a rectifier converts the AC power to a carefully regulated low voltage, which forces DC current to drive the plating process.

The resulting circuit channels the electrons into a path from the power supply to the cathode (object being plated), through the plating bath to the anode (positively charged) and back to the power supply. Since electrical current flows from positive to negative, the positively charged ions at the anode flow through the plating bath's metal electrolyte toward the negatively charged cathode. This movement causes the metal ions in the bath to migrate toward extra electrons located at the cathode's surface outer layer. By means of electrolysis, the metal ions are taken out of solution and are deposited as a thin layer onto the surface of the object. Theoretically, the thickness of the electroplated layer deposited on the object is determined by the time of plating, and the concentration of available metal ions in the bath relative to current density.

An electroplating process generally includes a cleaning step. The polarity may be set in the cleaning step to be a reverse polarity relative to the polarity used to electoplate. During this cleaning step, the electrochemical process becomes a process which etches (as opposed to plating material on) the sample surface.

Electroless plating is another electrochemical deposition plating method. In electroless plating, the electrolyte solution contains powerful reducing agents such as sodium borohydride or sodium hypophosphate which provides the reducing potential. Thus, an electroless plating process does not require a power supply required by traditional electroplating as discussed above.

The invention includes a method for electrochemically depositing epitaxial layers on textured surfaces, which includes the steps of providing a substrate with a textured surface and electrochemically depositing a substantially single orientation epitaxial layer on the textured surface.

The substrate can be any material having a textured surface. The textured surface is preferable a biaxially-textured surface. Biaxially-textured metal surfaces can be formed by rolling and annealing a metal material. Preferred substrates for rolling and annealing include Cu, Ag, Ni, Fe, Pd, Pt, Al, and their respective alloys.

The textured substrate can also be a single crystal substrate. The substrate can be Si or GaAs, these substrates preferably being single crystal substrates.

The substantially single orientation epitaxial layer can be a metal or metal alloy layer, the epitaxial metal layer selected from Cu, Ag, Ni, Fe, Pd, Pt, Al, and alloys thereof. At least one epitaxial buffer layer can be disposed on the epitaxial substantially single orientation layer.

The substantially single orientation epitaxial layer can include a wide variety of layers. For example, the substantially single orientation epitaxial layer can be a metal or metal alloy layer selected from Cu, Ag, Ni, Fe, Pd, Pt, Al and their alloys. For superconductor applications, Ni, Ni-alloys, Ag, Ag-alloys, Pd and Pd-alloy single orientation epitaxial layers are generally preferred.

The deposition rate may be controlled to be a vary during the electrochemical deposition. For example, it has been found that the quality of electrochemical epitaxy can be improved if interval deposition is used. The phrase "interval deposition" is defined herein as an electrochemical deposition process where the deposition rate as a function of deposition time is varied from the deposition rate as a function of deposition time which would result if process parameters are left substantially unchanged throughout the plating process. For example, interval deposition can comprise electroplating for a short time (e.g. 5 minutes), then stopping the plating process by opening the bias circuit, then closing the bias circuit, and so on. A simple programmable switch can be used to automatically open and close the bias circuit.

The reason interval deposition is believed to improve the epitaxial layer quality is that the plating deposition rate is inherently non-linear with time. The rate generally increases with increasing time due to ion build-up. As the deposition rate increases, the quality of the epitaxial layer formed generally suffers. Interval deposition can minimize ion buildup and keep the deposition substantially constant and lower than otherwise possible, resulting in the deposition of an improved epitaxial layer.

The method can include the step of translating the textured surface while performing the electrochemical deposition. The translation is preferably performed using a reel-to-reel mechanism. Reel to reel can permit continuous material feed.

EXAMPLES

Electroplating experiments were performed using two kinds of chemical solutions. The first solution was a cleaning solution comprised 60 g $NiCl_2$, 31 ml HCl and 250 ml $H_2O$, hereinafter referred to as Solution 1. The second solution comprised 300 g $NiSO_4$ 6 $H_2O$, 55 g $NiCl_2$, 43 g $H_3BO_4$ and 1 L $H_2O$, hereinafter referred to as Solution 2.

The equipment used for plating was standard electroplating equipment, such as a power supply connected to two electrodes and a plating bath to contain solutions. One electrode was a Ni electrode while the sample to be plated was the other electrode. Unless otherwise stated in these examples, the samples were first cleaned by immersion in Solution 1 at room temperature and then a voltage close to zero was applied for about two minutes. The polarity in the cleaning step can be set to be a small reverse voltage to etch the sample surface. However, the invention can generally produce good results even without a cleaning step.

Electrodeposition of Ni was then performed by immersing the sample in Solution 2, with the solution being at a fixed temperature, the temperature being less than 100° C. The polarity applied during plating was a high potential (+) to the Ni electrode and low potential (−) to the object to be plated. Plating deposition of Ni is then performed for varying times, depending on the desired plating layer thickness.

Figure 2:
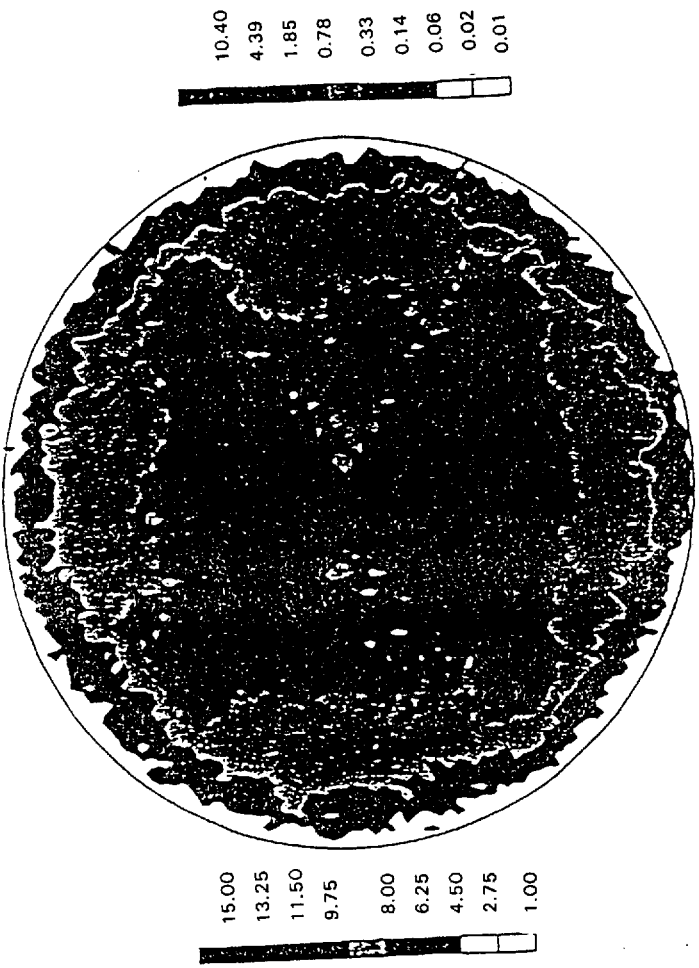
FIG. 2 illustrates the linear and log scale X-ray pole figure for a Cu substrate.
Figure 2:
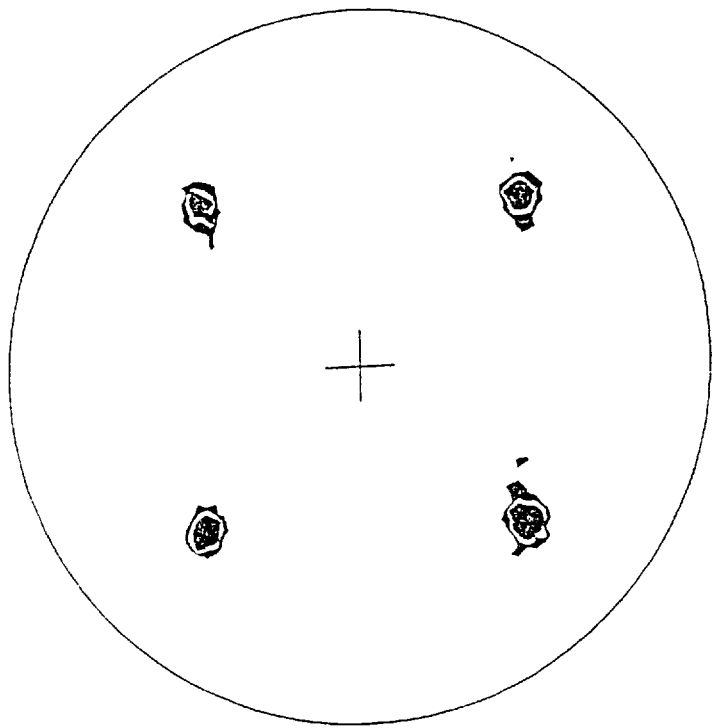
Figure 3:
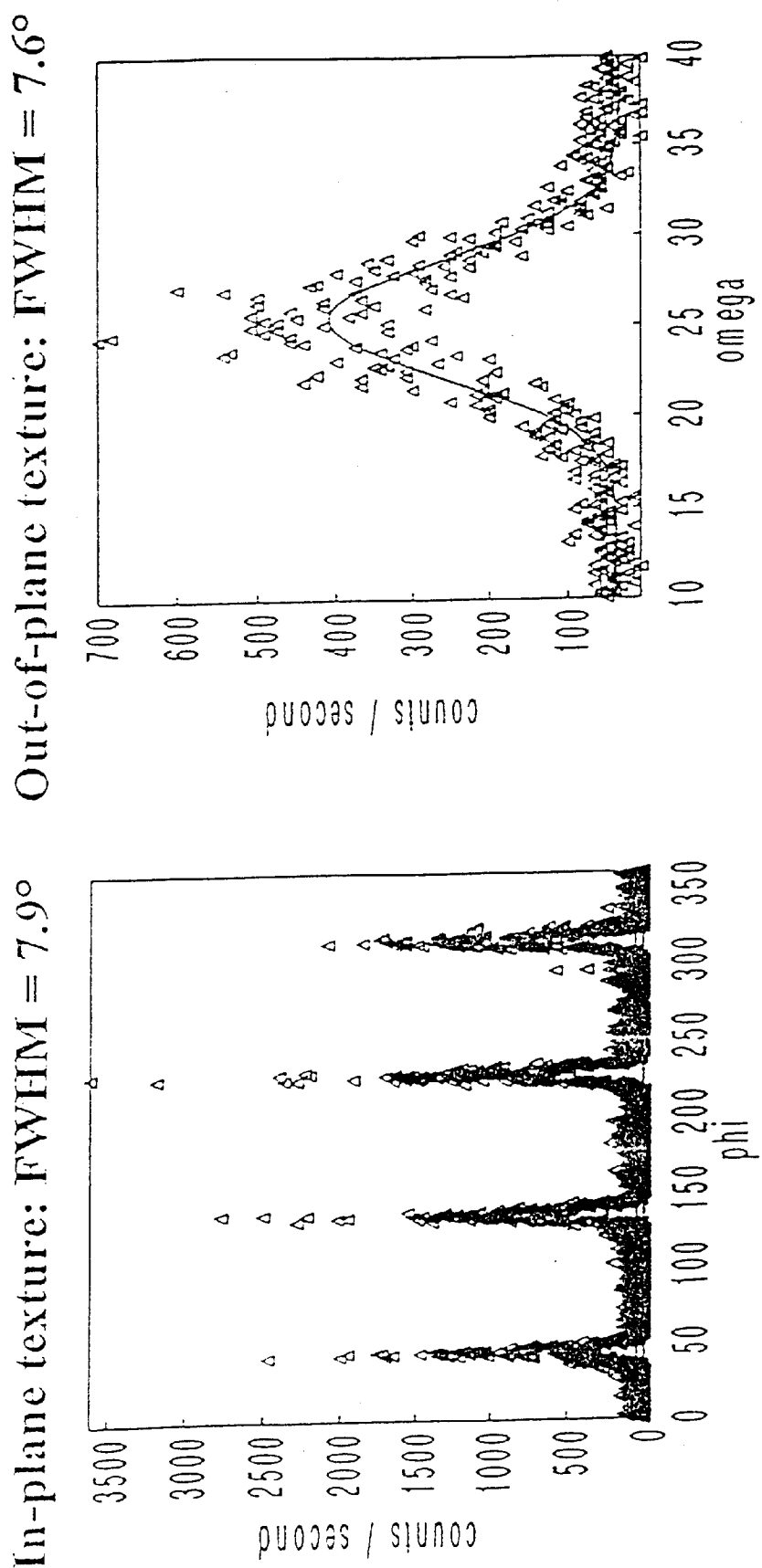
FIG. 3 illustrates $\phi$-scans and $\Omega$-scans for the Cu substrate shown in FIG. 2.

Substrates used for the experiment were biaxially textured Cu substrates fabricated using rolling and annealing techniques to have a very sharp cube texture by rolling and annealing techniques such as those disclosed in U.S. Pat. No. 5,741,377 to Goyal et al. FIG. 2 shows the linear and log scale X-ray pole figure for the rolled and annealed Cu substrate. A single component cube texture can be seen. FIG. 3 shows phi-scans and omega-scans for the Cu substrate. This phi-scan reflecting the degree of in-plane texture shows a FWHM of about 7.90°. The Omega scan reflects the out-of-plane texture showing a FWHM of about 7.6°.

Figure 4:
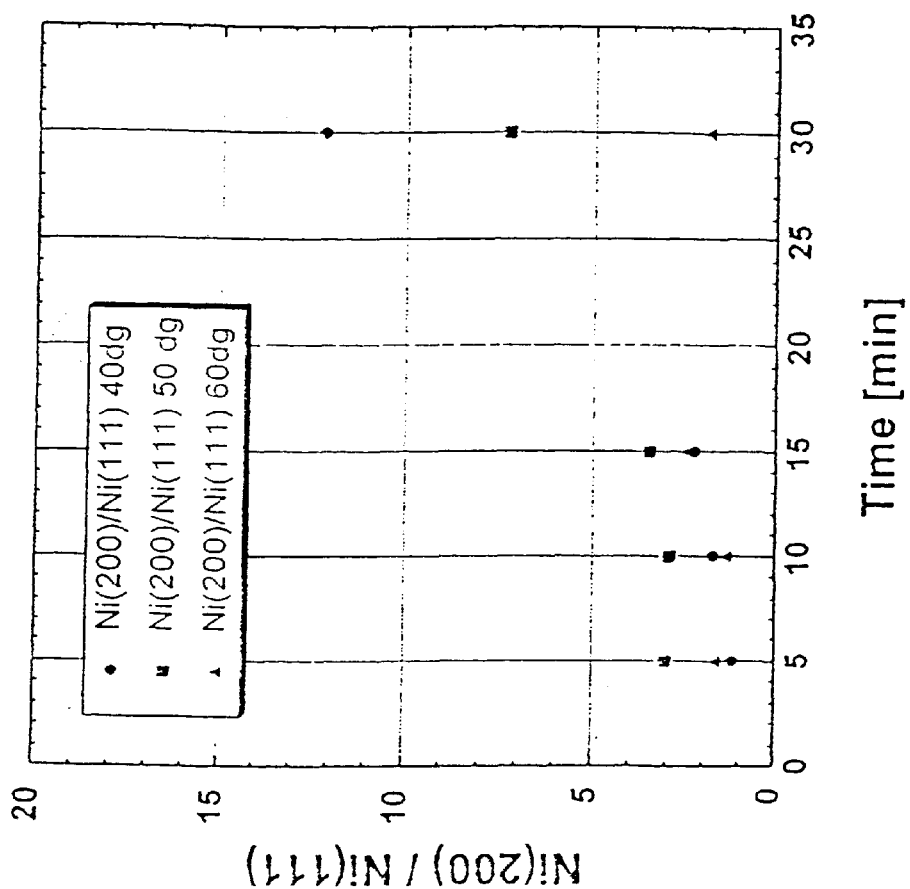
FIG. 4 illustrates the behavior of Ni coatings obtained by epitaxial electrodeposition on a textured Cu substrate as a function of deposition temperature and time.
Figure 5:
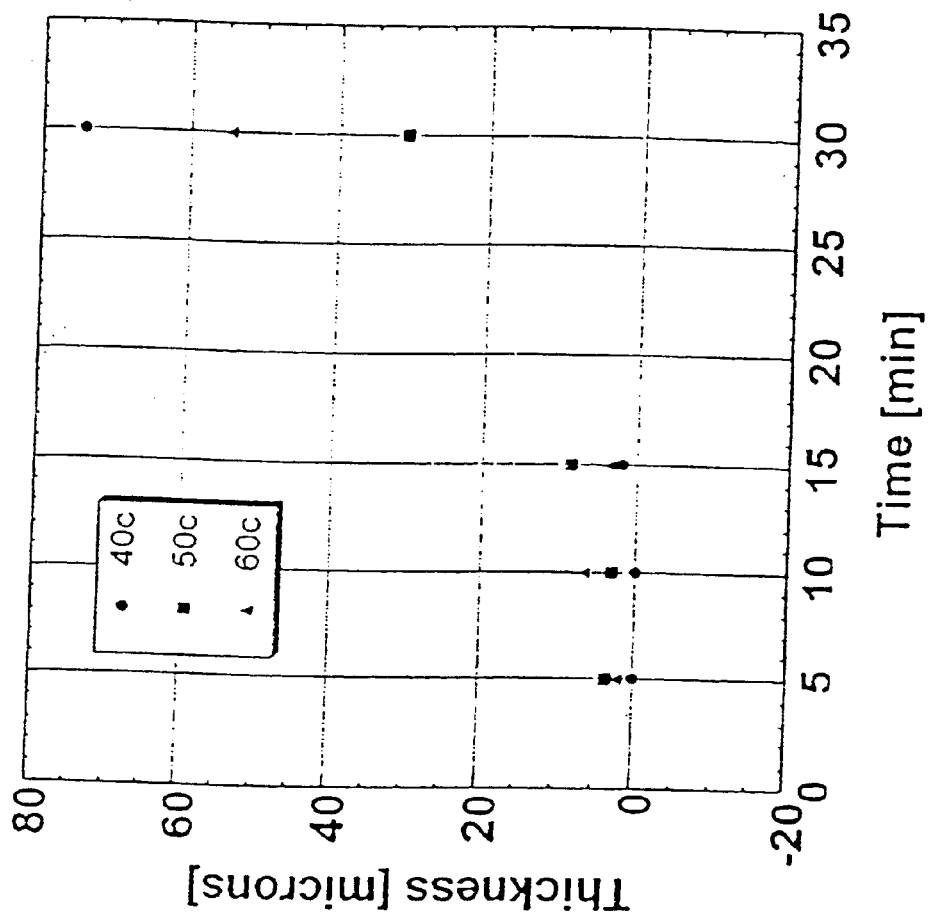
FIG. 5 illustrates the thickness of the electrodeposited Ni layer deposited as a function of time.

FIG. 4 shows the behavior of Ni coatings obtained by electrodeposition on textured the Cu substrate (shown in FIGS. 2 and 3) as a function of deposition temperature and time. The data is plotted as the intensity of Ni(200)/Ni(111) X-ray reflections in a 2θ plot. With decrease in temperature of deposition and increase in deposition time, better epitaxy, evidenced by a larger ratio is obtained. The corresponding thickness for the deposited Ni layer is shown in FIG. 5. At 40° C. in 30 mins, approximately a 70 μm thick layer of Ni was deposited epitaxially. The average deposition rate in this case is about 2.3 μm/minute.

Figure 6:
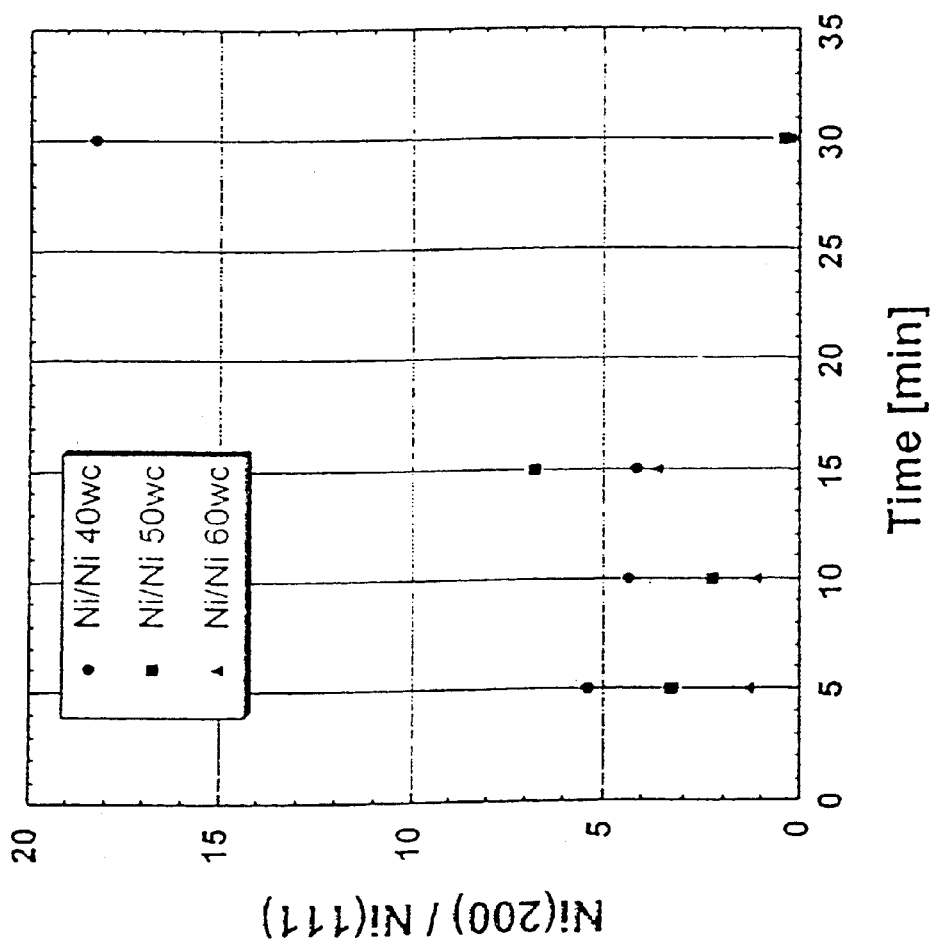
FIG. 6 illustrates data for electrodeposited Ni samples where a cleaning step was not used.
Figure 7:
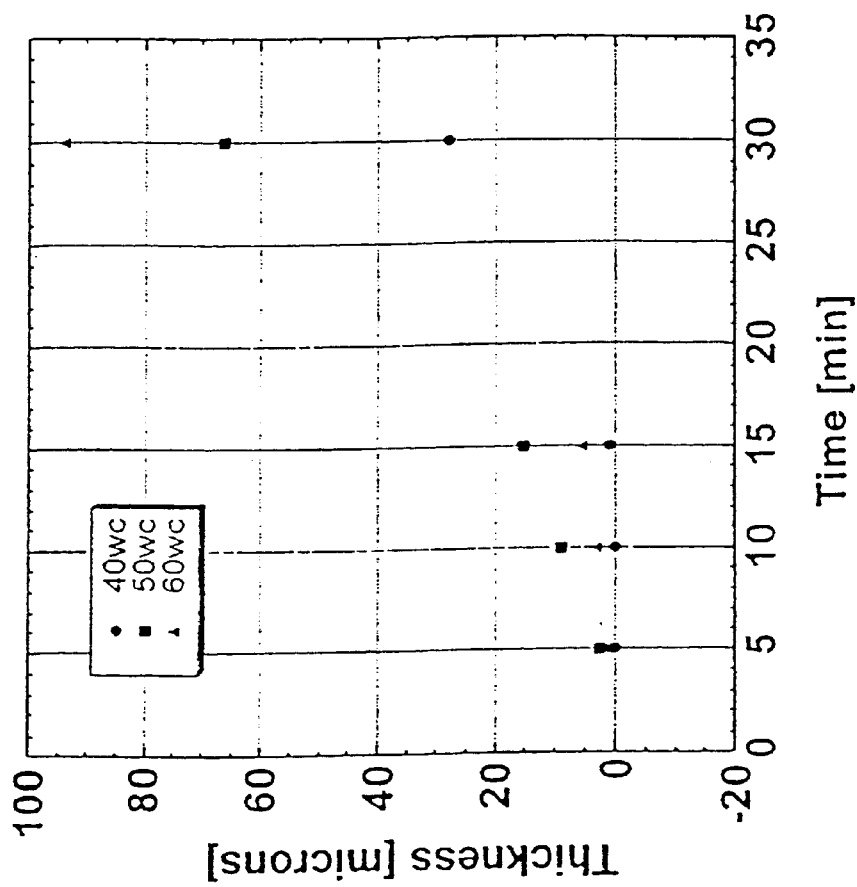
FIG. 7 illustrates the corresponding thickness data for electrodeposited Ni described with respect to FIG. 6.

FIG. 6 shows data for samples where the cleaning step was omitted. It can be seen that good epitaxy is still obtained. FIG. 7 shows the corresponding thickness data for these samples.

Figure 8:
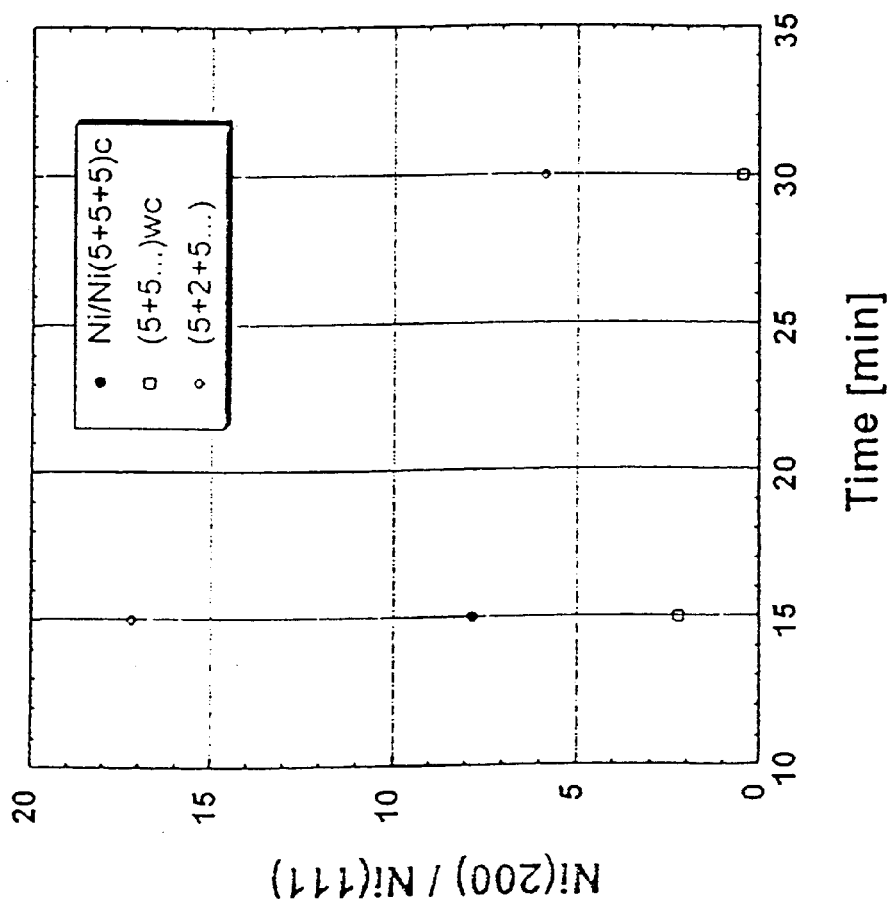
FIG. 8 illustrates data for electrodeposited Ni samples prepared using interval deposition.
Figure 9:
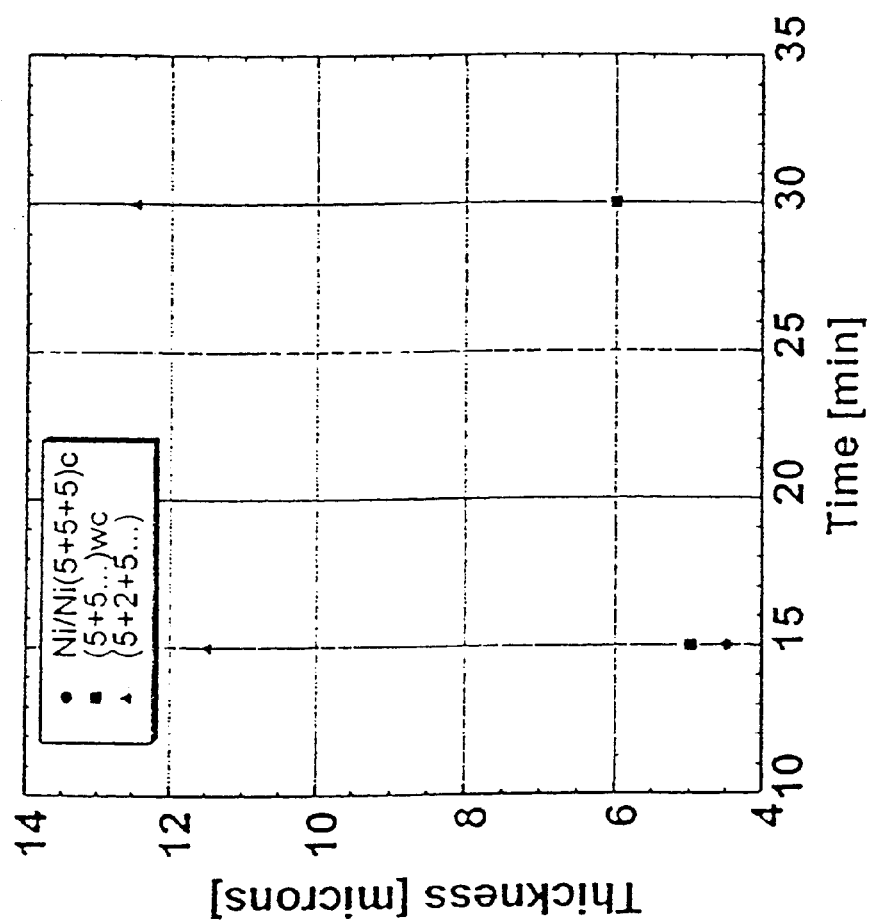
FIG. 9 illustrates the corresponding thickness of the Ni coatings formed by interval deposition described with respect to FIG. 8.

The quality of epitaxy can be improved even further if interval deposition is employed. In such a case, deposition is done for a short time, such as 5 minutes, then stopped, then started again, and so on. FIG. 8 shows data for samples prepared using interval deposition, both with and without cleaning. The diamonds represent a sample, where deposition was performed for 5 mins, then no deposition for 2 mins, and so on for a total time of 15 mins and 30 mins. Best results were obtained for 15 mins using interval deposition and 40° C. The corresponding thickness of the Ni coatings using interval deposition is shown in FIG. 9. A thickness of about 12 μm is obtained in 15 mins using the above described interval deposition.

Figure 10:
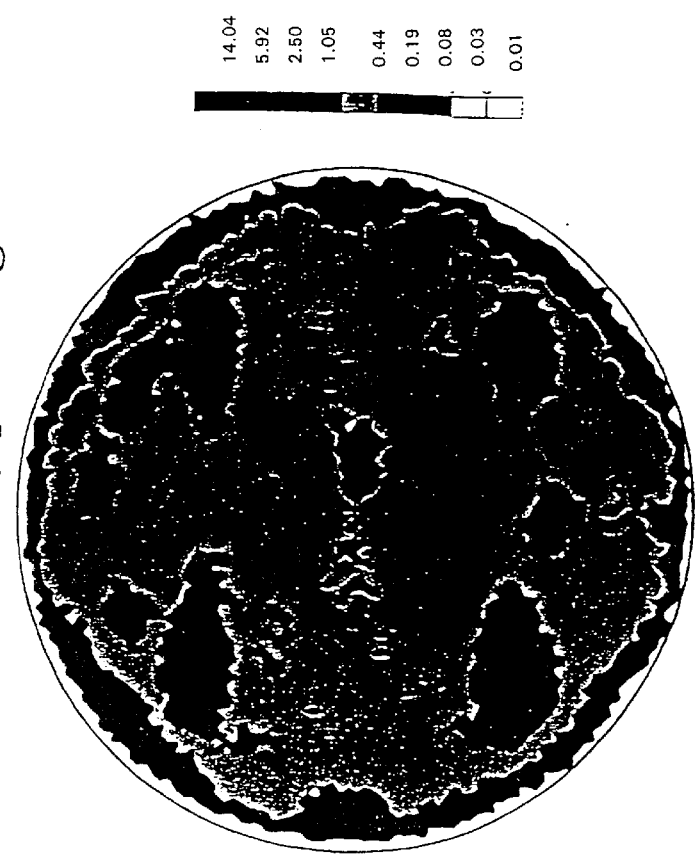
FIG. 10 illustrates the linear and log scale X-ray pole figure a Ni coating electrodeposited.
Figure 10:
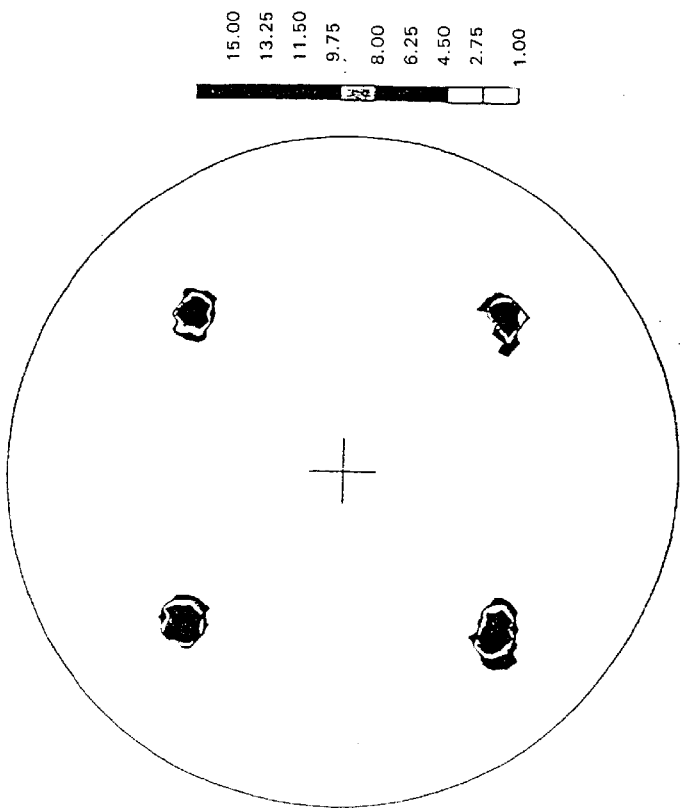
Figure 11:
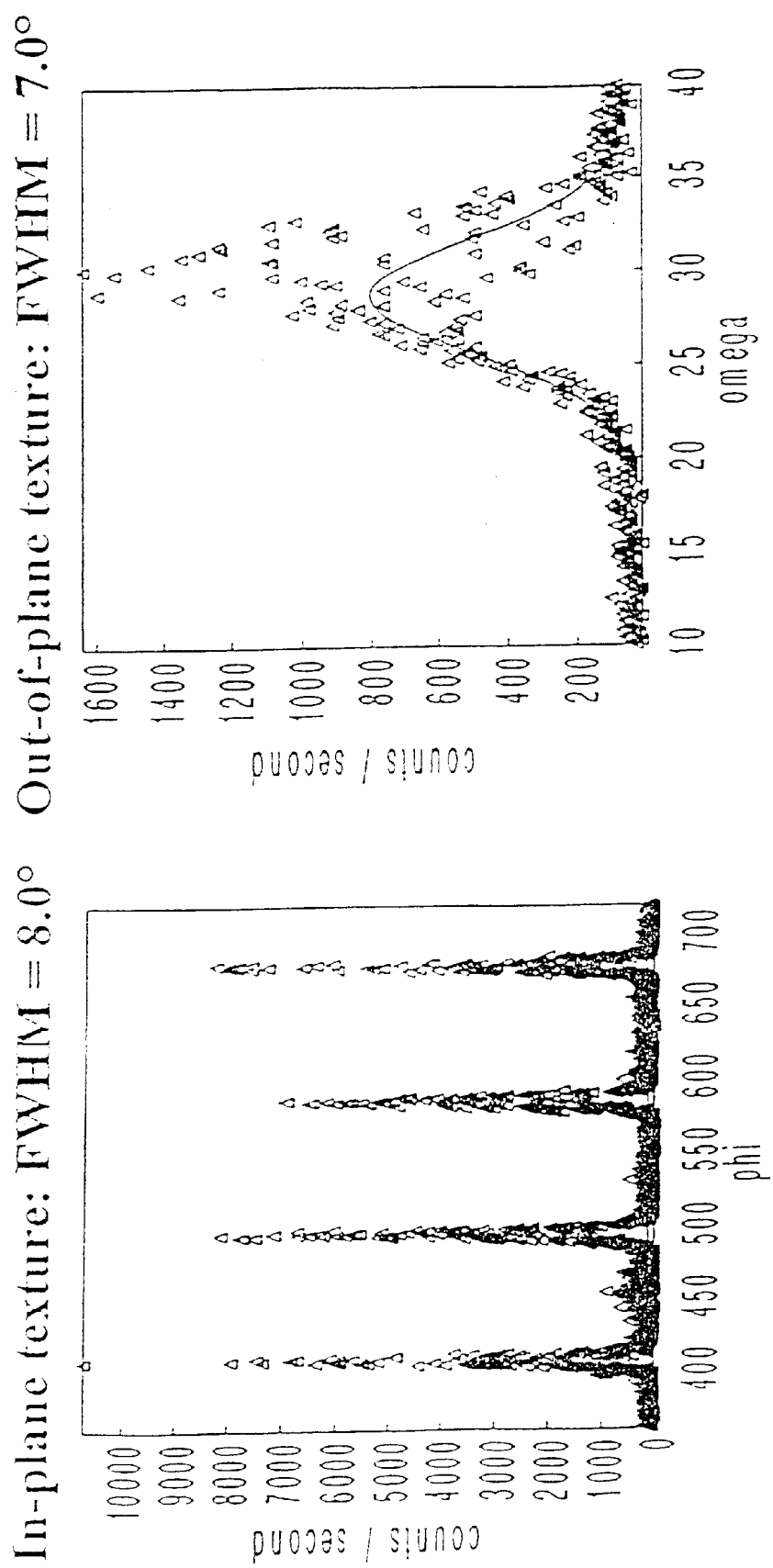
FIG. 11 illustrates $\phi$-scans and $\Omega$-scans for the Ni coating described with respect to FIG. 10.

FIG. 10 shows the linear and log scale x-ray pole figures for a high quality epitaxial Ni coating formed using the invention. A single component cube texture can be clearly seen. FIG. 11 shows phi-scans and omega-scans for the Ni epitaxial layer. The φ-scan reflecting the degree of in-plane texture shows a FWHM of 8.0°. The omega-scans reflecting the out-of-plane texture shows a FWHM of 7.0°. This represents excellent epitaxy between the Ni coating and the biaxially textured Cu substrate.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

I claim:

1. A method for electrochemically depositing epitaxial layers on substrates, comprising the steps:
   providing a substrate having a textured surface;
   electrochemically depositing a substantially single orientation epitaxial layer on said textured surface.

2. The method according to claim 1, wherein said textured surface is a metal surface, said metal surface being biaxially-textured.

3. The method according to claim 2, further comprising the step of rolling and annealing a metal or metal alloy to form said biaxially-textured surface.

4. The method according to claim 1, further comprising the step of rolling and annealing a metal or metal alloy substrate, said metal substrate comprising at least one metal selected from the group consisting of Cu, Ag, Ni, Fe, Pd, Pt and Al, and alloys thereof.

5. The method according to claim 1, wherein said substantially single orientation epitaxial layer comprises at least one metal or metal alloy selected from the group consisting of Cu, Ag, Ni, Fe, Pd, Pt, and Al, and alloys thereof.

6. The method according to claim 1, wherein said substantially single orientation epitaxial layer provides both in-plane texture and out-of-plane texture of less than 10 degrees FWHM.

7. The method according to claim 1, wherein said electrochemical deposition step produces a deposition rate of at least 1 $\mu$m/min.

8. The method according to claim 1, wherein said electrochemical deposition step is electroplating or electroless plating.

9. The method according to claim 1, further comprising the step of varying the deposition rate during said electrochemical deposition step.

10. The method according to claim 9, wherein said varying the deposition rate includes substantially suspending deposition during at least one interval during said electrochemical deposition step.

11. The method according to claim 1, further comprising the step of translating said textured surface while performing said electrochemical deposition.

12. The method according to claim 11, wherein said translating is performed using a reel-to-reel mechanism.

13. A method for preparing an electromagnetically active epitaxial article using at least one electrochemical step, comprising the steps of:
providing a substrate with a textured surface;
electrochemically depositing a substantially single orientation epitaxial layer on said textured surface, and
depositing an electromagnetically active layer on said substantially single orientation epitaxial layer.

14. The method according to claim 13, wherein said textured surface is biaxially-textured.

15. The method according to claim 14, further comprising the step of rolling and annealing a metal or metal alloy material to form said biaxially-textured surface.

16. The method according to claim 13, further comprising the step of rolling and annealing to form said textured surface, wherein said textured surface is a textured metal surface comprised of at least one metal or metal alloy selected from the group consisting Cu, Ag, Ni, Fe, Pd, Pt, and Al, and alloys thereof.

17. The method according to claim 13, wherein said substantially single orientation epitaxial layer comprises at least one metal or metal alloy selected from the group consisting of Cu, Ag, Ni, Fe, Pd, Pt, and Al, and alloys thereof.

18. The method according to claim 13, wherein said substantially single orientation epitaxial layer provides both in-plane texture and out-of-plane texture of less than 10 degrees FWHM.

19. The method according to claim 13, wherein said electromagnetically active layer includes a superconducting layer.

20. The method according to claim 19, wherein superconductor layer comprises an oxide superconductor.

21. The method according to claim 20, wherein said oxide superconductor is selected from the group consisting of $REBa_2Cu_3O_7$ where RE is a rare earth element, $(Bi, Pb)_1Sr_2Ca_{n-1}Cu_nO_{2n+2}$, where n is an integer between 1 and 4, $(Tl, Pb)_1Ba_2Ca_{n-1}Cu_nO_{2n+3}$, where n is an integer between 1 and 4 and $(Hg, Tl, Pb)_1Ba_2Ca_{n-1}Cu_nO^{2n+2}$, where n is an integer between 1 and 4.

22. The method according to claim 13, wherein said electromagnetically active layer is deposited by a process comprising electrochemical deposition.

23. The method according to claim 13, further comprising the step of depositing at least one epitaxial buffer layer on and in contact with said substantially single orientation epitaxial layer.

24. The method according to claim 23, wherein said electromagnetically active layer includes a superconducting layer.

25. The method according to claim 24, wherein said superconductor layer comprises an oxide superconductor.

26. The method according to claim 23, wherein at least one of said epitaxial buffer layers are deposited by a process comprising electrochemical deposition.

27. The method according to claim 26, wherein said electromagnetically active layer is deposited by a process comprising electrochemical deposition.

28. The method according to claim 27, wherein said electromagnetically active layer includes a superconducting layer.

29. The method according to claim 28, wherein superconductor layer comprises an oxide superconductor.

30. The method according to claim 29, wherein said oxide superconductor is selected from the group consisting of $REBa_2Cu_3O_7$ where RE is a rare earth element, $(Bi, Pb)_1Sr_2Ca_{n-1}Cu_nO_{2n+2}$, where n is an integer between 1 and 4, $(Tl, Pb)_1Ba_2Ca_{n-1}Cu_nO_{2n+3}$, where n is an integer between 1 and 4 and $(Hg, Tl, Pb)_1Ba_2Ca_{n-1}Cu_nO^{2n+2}$, where n is an integer between 1 and 4.

* * * * *